United States Patent
Lee et al.

(10) Patent No.: US 12,444,600 B2
(45) Date of Patent: Oct. 14, 2025

(54) GALLIUM NITRIDE DEVICE HAVING A COMBINATION OF SURFACE PASSIVATION LAYERS

(71) Applicant: Texas Instruments Incorporated, Dallas, TX (US)

(72) Inventors: Dong Seup Lee, McKinney, TX (US); Jungwoo Joh, Allen, TX (US); Yoshikazu Kondo, Sachse, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 747 days.

(21) Appl. No.: 17/491,185

(22) Filed: Sep. 30, 2021

(65) Prior Publication Data

US 2023/0094094 A1    Mar. 30, 2023

(51) Int. Cl.
*H01L 21/02* (2006.01)
*H01L 23/29* (2006.01)
(Continued)

(52) U.S. Cl.
CPC ........ *H01L 21/022* (2013.01); *H01L 21/0217* (2013.01); *H01L 21/02271* (2013.01);
(Continued)

(58) Field of Classification Search
CPC ........... H01L 29/2003; H01L 29/66462; H01L 29/7786; H01L 23/291; H01L 23/3171; H01L 23/3192; H01L 29/0217; H01L 29/022; H10D 30/015; H10D 30/475; H10D 62/8503; H10D 84/87; H10D 1/041; H10D 84/406
See application file for complete search history.

(56) References Cited

U.S. PATENT DOCUMENTS 10,014,231 B1    7/2018  Lee et al.
10,134,596 B1    11/2018  Lee et al.
(Continued)

FOREIGN PATENT DOCUMENTS

WO    WO-2013108844 A1 *  7/2013  ........... H01L 29/402

OTHER PUBLICATIONS

Translation of Kurita (Year: 2013).*

*Primary Examiner* — Steven B Gauthier
*Assistant Examiner* — Rhys Poniente Sheker
(74) *Attorney, Agent, or Firm* — Yudong Kim; Frank D. Cimino

(57) ABSTRACT

A method of fabricating a semiconductor device includes providing a GaN substrate with an epitaxial layer formed thereover, the epitaxial layer forming a heterojunction with the GaN substrate, the heterojunction supporting a 2-dimensional electron gas (2DEG) channel in the GaN substrate. A composite surface passivation layer is formed over a top surface of the epitaxial layer, wherein the composite surface passivation layer comprises a first passivation layer portion formed proximate to a first region of the GaN device and a second passivation layer portion formed proximate to a second region of the GaN device. The first and second passivation layer portions are disposed laterally adjacent to each other over the epitaxial layer, wherein the first passivation layer portion is formed in a first process and the second passivation layer portion is formed in a second process.

25 Claims, 7 Drawing Sheets

(51) Int. Cl.
  *H01L 23/31* (2006.01)
  *H01L 29/20* (2006.01)
  *H01L 29/66* (2006.01)
  *H01L 29/778* (2006.01)
  *H10D 30/01* (2025.01)
  *H10D 30/47* (2025.01)
  *H10D 62/85* (2025.01)

(52) U.S. Cl.
  CPC ........ *H01L 23/291* (2013.01); *H01L 23/3171* (2013.01); *H01L 23/3192* (2013.01); *H10D 30/015* (2025.01); *H10D 30/475* (2025.01); *H10D 62/8503* (2025.01)

(56) References Cited

U.S. PATENT DOCUMENTS

| | | |
|---|---|---|
| 10,192,799 B2 | 1/2019 | Lee et al. |
| 10,483,356 B2 | 11/2019 | Chen et al. |
| 2007/0207626 A1* | 9/2007 | Nishi .................. H01L 21/302 438/758 |
| 2017/0062419 A1* | 3/2017 | Rose .................. H10D 89/611 |
| 2017/0125571 A1* | 5/2017 | Huang ................ H01L 21/0217 |
| 2022/0376104 A1* | 11/2022 | Bisges ................ H10D 62/824 |
| 2023/0299022 A1* | 9/2023 | Tang .................. H10D 64/111 257/288 |

* cited by examiner

GALLIUM NITRIDE DEVICE HAVING A COMBINATION OF SURFACE PASSIVATION LAYERS

FIELD OF THE DISCLOSURE

Disclosed implementations relate generally to the field of semiconductor fabrication, and more particularly, but not exclusively, to a method of fabricating a gallium nitride (GaN) device having a combination of surface passivation layers.

BACKGROUND

Without limitation, the following is provided in the context of fabricating a GaN device as an example of a class of semiconductor devices known as high-electron-mobility transistor (HEMT) devices based on Group III nitrides.

Silicon-based devices and integrated circuits (ICs) are used in diverse areas of solid-state electronics. One such area is power electronics. In an effort to improve the system-level efficiency of power electronic systems, research efforts are being undertaken to develop other kinds of semiconductor materials that can replace silicon as a power-electronic semiconductor.

GaN devices have attracted great attention due to their ability to operate well at higher frequencies and voltages than silicon devices. It is known, however, that GaN transistors experience increased effective On-state resistance when switched at high voltage and frequency due to charge trapping in the device. This increased resistance (often more than twice with respect to dc) is variously known as current collapse, dynamic On-state resistance, or dynamic $R_{DSOn}$.

Another type of GaN device failure is Time-Dependent Dielectric Breakdown (TDDB), which occurs when a high electric field exists across the gate dielectric causing defects to be generated. These defects eventually form a conduction path through the dielectric, rendering the device unusable. This is a major concern in GaN HEMTs because they are typically used as switches in high voltage circuits and spend a significant amount of time in the Off-state. When off, transistors have to block the high voltage being applied to the drain. The high voltage difference between the drain and the gate forms a strong electric field across the gate dielectric, thereby leading to defect formation.

SUMMARY

In one aspect, an implementation of a semiconductor device fabrication method is disclosed wherein a combination of different surface passivation processes may be provided in an HEMT device in order to enhance device reliability. The method comprises, inter alia, providing a GaN material, e.g., as a substrate or layer, with an epitaxial layer formed thereover, the epitaxial layer forming a heterojunction with the GaN substrate layer, wherein the heterojunction is operative to support a 2-dimensional electron gas (2DEG) channel in the GaN substrate layer. A composite surface passivation layer is formed over a top surface of the epitaxial layer, wherein the composite surface passivation layer comprises a first passivation layer portion formed proximate to a first region of the GaN device and a second passivation layer portion formed proximate to a second region of the GaN device. The first and second passivation layer portions are disposed laterally adjacent to each other over the epitaxial layer, wherein the first passivation layer portion is formed as part of a first passivation layer in a first process that may be optimized for a first performance parameter of the device, e.g., TDDB, and the second passivation layer portion is formed as part of a second passivation layer in a second process that may be optimized for a second performance parameter of the device, e.g., $R_{DSOn}$. In one arrangement, the first region where the first passivation layer portion is formed may comprise a gate region of the semiconductor device. In one arrangement, the second region where the second passivation layer portion is formed may comprise a drain access region of the semiconductor device. In some arrangements, the first region may comprise the drain access region while the second region may comprise the gate region. In some implementations, the first and second processes may each comprise a Low-Pressure Chemical Vapor Deposition (LPCVD) process, wherein the first process may involve a recipe that uses higher $O_2$ levels than are used in the second process during the loading of process wafers containing the HEMT devices into the LPCVD chamber. In one arrangement, the second process may involve using a low vacuum pump stabilization pressure in a stabilization step prior to the deposition of a dielectric material as the second passivation layer. In one arrangement, an example HEMT device fabrication method may involve forming a first plurality of portions of one passivation type interspersed with a second plurality of portions of another passivation type, each optimized for respective device reliability/performance parametrics.

In one aspect, a method of fabricating a GaN device is disclosed that optimizes both TDDB and $R_{DSOn}$ performance without adding extra mask layers. The method comprises, inter alia, forming a first passivation layer, using a first process, over a top surface of an epitaxial layer of a GaN substrate, and patterning the first passivation layer to define a gate region opening and a drain access region opening, thereby producing a patterned first passivation layer, wherein a portion of the first passivation layer extends laterally between the gate region opening and the drain access region opening. Using a second process, a second passivation layer may be formed over the patterned first passivation layer including the gate region opening and the drain access region opening. The second passivation layer may be patterned to define a gate contact opening in the gate region opening, thereby producing a patterned second passivation layer. A gate dielectric layer may be formed over the patterned second passivation layer. A gate contact, a source contact and a drain contact may be formed to complete contact formation/metallization of the GaN device, wherein the gate contact is formed over a portion of the gate dielectric layer disposed in the gate contact opening and the source and drain contacts are formed in respective regions of the epitaxial layer of the GaN substrate. In one arrangement, the first process for forming the first passivation layer may be controlled for providing passivation proximate to the gate region that is optimized for TDDB. In one arrangement, the second process for forming the second passivation layer may be controlled for providing passivation proximate to the drain access region that is optimized for $R_{DSOn}$ performance.

BRIEF DESCRIPTION OF THE DRAWINGS

Implementations of the present disclosure are illustrated by way of example, and not by way of limitation, in the Figures of the accompanying drawings. It should be noted that different references to "an" or "one" implementation in this disclosure are not necessarily to the same implementation, and such references may mean at least one. Further, when a particular feature, structure, or characteristic is described in connection with an implementation, it is submitted that it is within the knowledge of one skilled in the art to effect such feature, structure, or characteristic in connection with other implementations whether or not explicitly described.

The accompanying drawings are incorporated into and form a part of the specification to illustrate one or more example implementations of the present disclosure. Various advantages and features of the disclosure will be understood from the following Detailed Description taken in connection with the appended claims and with reference to the attached drawing Figures in which:

DETAILED DESCRIPTION OF THE DRAWINGS

Figure 1:
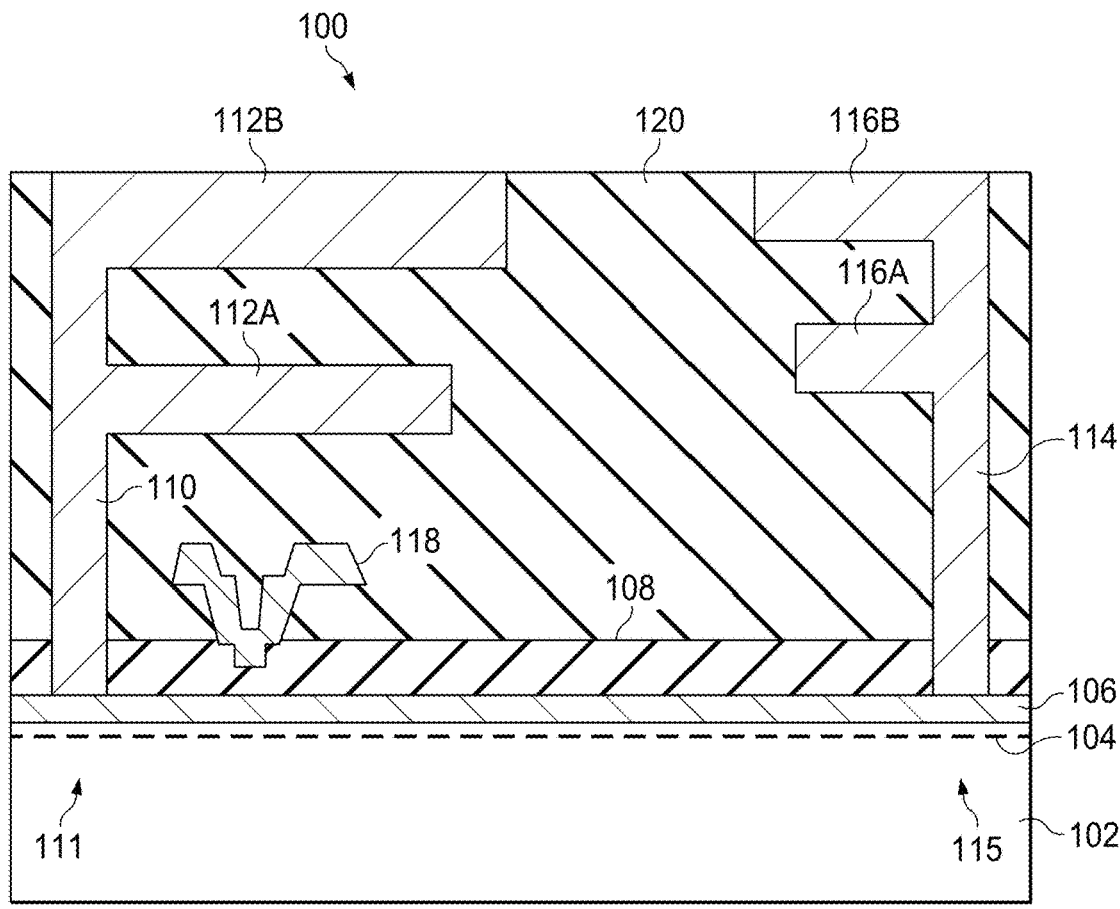
FIG. 1 depicts a cross-sectional schematic view of a baseline GaN device having a single surface passivation layer.

Example embodiments of the disclosure are described with reference to the attached Figures wherein like reference numerals are generally utilized to refer to like elements. The Figures are not drawn to scale and they are provided merely to illustrate example embodiments. Numerous specific details, relationships, and methods are set forth below to provide an understanding of one or more example embodiments. However, it should be understood that some embodiments may be practiced without such specific details. In other instances, well-known circuits, subsystems, components, structures and techniques have not been shown in detail in order not to obscure the understanding of the example embodiments. Accordingly, it will be appreciated by one skilled in the art that the embodiments of the present disclosure may be practiced without such specific components.

In the following description, reference may be made to the accompanying drawings wherein certain directional terminology, such as, e.g., "upper", "lower", "top", "bottom", "left-hand", "right-hand", "front side", "backside", "vertical", "horizontal", etc., may be used with reference to the orientation of the Figures or illustrative elements thereof being described. Because components of some embodiments can be positioned in a number of different orientations, the directional terminology is used for purposes of illustration and is in no way limiting. Likewise, references to features referred to as "first", "second", etc., are not indicative of any specific order, importance, and the like, and such references may be interchanged mutatis mutandis, depending on the context, implementation, etc. Further, the features of example embodiments described herein may be combined with each other unless specifically noted otherwise.

As used herein, the term "couple" or "couples" is intended to mean either an indirect or direct conductive connection unless qualified as in "communicably coupled" which may include wireless connections. Thus, if a first device couples to a second device, that connection may be through a direct conductive connection, or through an indirect conductive connection via other devices and connections.

Among the materials being investigated to replace silicon as a semiconductor in power electronics are the Group III nitrides. Certain characteristics (e.g., polarization) of Group III nitrides can be engineered by changing their material compositions. For instance, depositing Group III nitride material with a broader bandgap (e.g., AlN) on Group III nitride material with a narrower bandgap (e.g., gallium nitride (GaN)) can result in the formation of an $Al_xGa_{(1-x)}N$ layer (where X and (1−X) refer to the relative composition of aluminum and gallium). In some cases, the material composition of an Al—Ga—In—N layer having suitable respective percentages can be tailored to tune the bandgap of $Al_xGa_{(1-x)}N$ layer. It is known that $Al_xGa_{(1-x)}N$ material, when grown on the top of a Group III nitride (e.g., GaN), can result in the formation of a two-dimensional electron gas ("2DEG") or "channel" that has high carrier density and mobility. These features, together with the superior electrical breakdown strength of Group III nitrides, make Group III nitride materials strong candidates for high frequency power electronic semiconductors.

Referring to FIG. 1, depicted therein is a cross-sectional schematic view of a baseline GaN device having a surface passivation layer that may be fabricated using a single passivation process involving a process recipe for optimizing a particular parameter or characteristic of the GaN device, such as, e.g., Time-Dependent Dielectric Breakdown (TDDB), dynamic On-state resistance ($R_{DSOn}$), etc. In general, baseline GaN device 100 may include a layer 106 of aluminum gallium nitride (AlGaN) epitaxially grown over a GaN layer 102, which in turn may be formed over a substrate material (not specifically shown). Because the AlGaN and GaN layers exhibit different bandgaps, they are said to meet at a heterojunction. Under proper conditions, a 2DEG or channel 104 may be formed at the heterojunction interface of the GaN and AlGaN layers as noted above. In the 2DEG channel, some electrons are unbound to atoms and free to move, providing higher mobility as compared with other types of transistors. Accordingly, little or no doping of the substrate may be required for operation of GaN device 100. A source contact or terminal 110, a drain contact or terminal 114 and a gate contact or terminal 118 may be formed with respect to an active area of the device. An optional substrate terminal may be provided at a lower portion of the device but this is not a requirement. Whereas in a normally ON mode device (i.e., a depletion mode device), the 2DEG channel extends from source region 111 to drain region 115 of the device without any discontinuity, as illustrated in FIG. 1, an enhancement mode device (i.e., a normally OFF mode device), the channel is absent in gate region 119 associated with gate terminal 118 until the device is turned on.

In some arrangements, one or more field plates may be optionally provided in association with one or more of the device terminals, e.g., source 110, drain 114 and/or gate 118, to mitigate the effects of peak electric fields on the channel caused by the high voltage operation of the device 100. By way of illustration, source field plates 112A, 112B and drain field plates 116A, 116B are exemplified in FIG. 1, which may laterally extend into an inter-level dielectric (ILD) insulator layer 120 and may be covered by a protective overcoat (PO) of the device 100.

Surface passivation layer 108 of baseline GaN device 100 may be deposited over the entire AlGaN layer 106 using suitable dielectric materials (e.g., silicon nitride (SiN)) and a deposition process (e.g., Low-Pressure Chemical Vapor Deposition (LPCVD) process), which may be managed to optimize certain key parameters relating to device reliability and performance, e.g., TDDB, dynamic $R_{DSOn}$, etc., prior to patterning a gate region opening therein for facilitating the deposition of gate dielectric material (not specifically shown in this FIG.) and subsequent formation of gate terminal 118. However, TDDB and dynamic $R_{DSOn}$ (e.g., higher On-state resistance following Off-state voltage stress and switching transition) of a GaN device typically show a tradeoff behavior with respect to surface passivation in that a passivation process that improves TDDB typically degrades dynamic $R_{DSOn}$ whereas a passivation process which can provide better dynamic $R_{DSOn}$ can make TDDB worse. Because of this tradeoff, baseline GaN device 100 may have either TDDB or dynamic $R_{DSOn}$ performance compromised depending on which type of passivation process is employed in a process flow, thereby negatively affecting the overall device performance. By way of illustration, a passivation process using a particular recipe (e.g., recipe A) optimized for TDDB may cause a degradation in dynamic $R_{DSOn}$ performance of the device by introducing electron trapping. On the other hand, a passivation process using another recipe (e.g., recipe B) optimized for dynamic $R_{DSOn}$ may cause gate TDDB issues by increasing the electric field over the channel whereby the device may experience $V_{DG}$ breakdown over time.

Examples described herein recognize the challenges posed by the foregoing design tradeoff and advantageously provide a process flow combining two different types of surface passivation processes, each of which may be optimized for a different performance parameter, that may be applied in fabricating a high-electron-mobility transistor (HEMT), also known as heterostructure field-effect transistor (HFET), such as a Group III nitride device, without adding an extra mask or specific On-resistance ($R_{SP}$) penalty. Broadly, in an example embodiment, a passivation process optimized for TDDB may be applied for providing a surface passivation layer near a gate region of the device where TDDB is critical, and a passivation process providing a surface passivation layer that is optimized for dynamic $R_{DSOn}$ performance may be applied near a drain access region of the device.

Although the discussion that follows is directed primarily to embodiments based on GaN, it will be understood that the disclosed devices and methods are not so limited. In one embodiment, an example HEMT device may contain nitride compounds of elements from Group III of the Periodic Table of Elements. In one embodiment, the active layers may comprise a composition having the formula $Al_xIn_yGa_{(1-X-Y)}N$, where X, Y and (1–X–Y) refer to relative portions of aluminum, indium and gallium, respectively. In some additional and/or alternative embodiments, the active layers may comprise $B_wAl_xIn_yGa_zN$ materials, in which w, x, y and z each has a suitable value between zero and one (inclusive). The reference herein to $B_wAl_xIn_yGa_zN$ or a $B_wAl_xIn_yGa_zN$ material may refer to a semiconductor material having nitride and one or more of boron, aluminum, indium and gallium or a sub-combination thereof. Examples of $B_wAl_xIn_yGa_zN$ materials include GaN, AlN, AlGaN, AlInGaN, InGaN, and BAlInGaN, by way of illustration. A $B_wAl_xIn_yGa_zN$ material may include other materials besides nitride, boron, aluminum, indium and/or gallium. For example, a $B_wAl_xIn_yGa_zN$ material may be doped with a suitable dopant such as silicon and germanium.

Figure 2A:
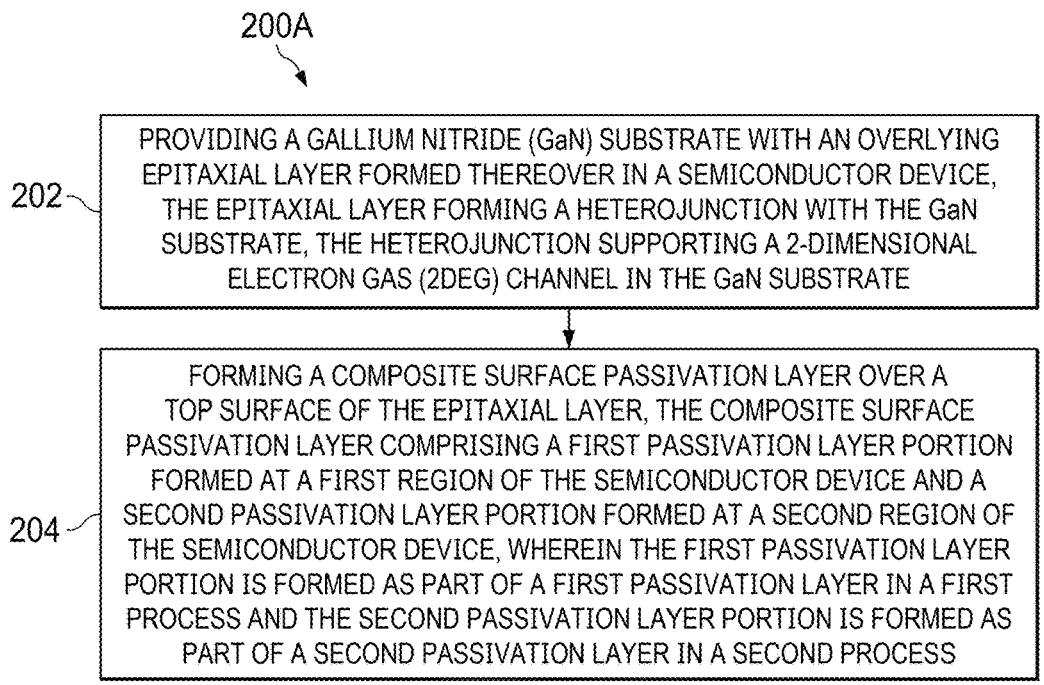
FIGS. 2A-2C depict flowcharts of steps, blocks or acts that may be combined with respect to an example method for fabricating a GaN device having a combination of surface passivation layers according to an implementation of the disclosure.
Figure 2B:
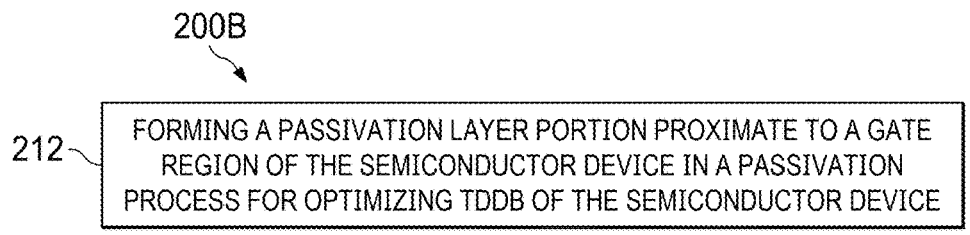
Figure 2C:
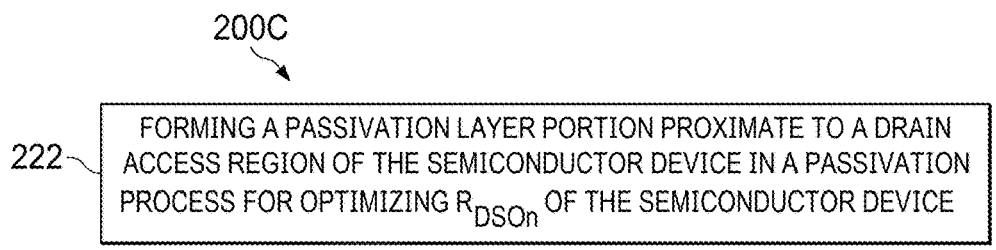

FIGS. 2A-2C depict flowcharts of steps, blocks or acts that may be combined and/or implemented in various ways with respect to an example method for fabricating an HEMT semiconductor device (e.g., a GaN device) having a combination of surface passivation layers in a composite passivation structure according to the teachings of the disclosure. Process flow 200A of FIG. 2A exemplifies a high level process according to one embodiment. At block 202, a GaN substrate or layer with an epitaxial layer formed thereover is provided as part of the semiconductor device, wherein the epitaxial layer forms a heterojunction with the GaN substrate layer, the heterojunction operating to support a 2DEG channel in the GaN substrate layer. In one arrangement, the epitaxial layer may comprise an AlGaN layer. At block 204, a composite surface passivation layer may be formed over a top surface of the epitaxial layer, the composite surface passivation layer comprising a first passivation layer portion formed at a first region of the semiconductor device and a second passivation layer portion formed at a second region of the semiconductor device, wherein the first passivation layer portion is formed as part of a first passivation layer in a first process and the second passivation layer portion is formed as part of a second passivation layer in a second process. In one arrangement, the first and second processes may comprise LPCVD processes that may be adjusted or otherwise controlled in terms of respective processing conditions or recipes so as to cause the deposition of dielectric layers that passivate the surface region relative to the gate and drain regions in different manners, thereby optimizing different reliability parameters of the device.

Process flow 200B shown in FIG. 2B exemplifies a fabrication flow wherein a passivation process that optimizes TDDB may be applied in one region (e.g., the gate region) as set forth at block 212. Process flow 200C shown in FIG. 2C exemplifies a fabrication flow wherein a passivation process that optimizes dynamic $R_{DSOn}$ performance may applied in another region, e.g., near the drain access region of the device, as set forth at block 222. Depending on implementation, example passivation processes may or may not include the same dielectric materials. Broadly, an embodiment of the foregoing involves using two different passivation processes (and/or materials) around or relative to the gate region vs. the drain access region for optimizing the relevant reliability parameters without having to incur the cost of the tradeoff of the baseline process set forth above. As will be described further below, an example embodiment herein may involve providing an opening in one passivation layer (e.g., a first passivation layer) comprising a first dielectric material and redeposit another passivation layer (e.g., a second passivation layer) comprising a second dielectric material, each being optimized for a particular reliability parameter. It will be further seen that in some additional and/or alternative embodiments, multiple openings may be provided in one passivation layer for depositing and fabricating a corresponding set of portions of another passivation layer.

Depending on implementation, the passivation processes for depositing dielectric materials that optimize TDDB and dynamic $R_{DSOn}$ performance may be applied in any order. In other words, a passivation that optimizes TDDB may be applied first in one example arrangement followed by a second passivation that optimizes the $R_{DSOn}$ performance. In another arrangement, a passivation that optimizes the $R_{DSOn}$ performance of the device may be applied first followed by a second passivation that optimizes TDDB. In a still further arrangement, a gate dielectric material itself may be used as a second passivation layer that is also optimized for a relevant reliability parameter (e.g., TDDB or dynamic $R_{DSOn}$ performance). In still further arrangements, the active region between the gate and the drain may be deposited with one or more portions of one passivation material (e.g., according to one passivation process) that may be interspersed with one or more portions of another passivation material (e.g., according to another passivation process). Further, the lateral dimensions of the different passivation layer portions, which may be disposed laterally adjacent to each other over the active area (e.g., along a first horizontal direction or axis parallel to the epitaxy/substrate surface), may be varied by adjusting the respective feature sizes of a photomask used for patterning a first passivation layer, whereby passivation layer portions having variable sizes may be accommodated for fabricating devices having different line geometries.

Set forth below are additional details with respect to an example implementation of a process flow wherein a depletion mode (D-mode) GaN device fabrication flow is particularly exemplified without limitation.

Figure 3A:
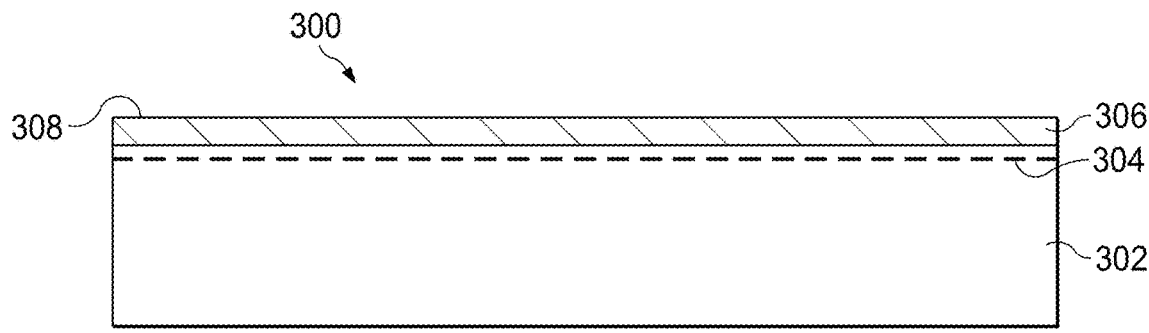
FIGS. 3A-3F illustrate cross-sectional schematic views of a semiconductor process wafer portion at various stages of an example process flow for fabricating a GaN device having dual surface passivation layers as part of a composite surface passivation layer according to an implementation of the disclosure.
Figure 3B:
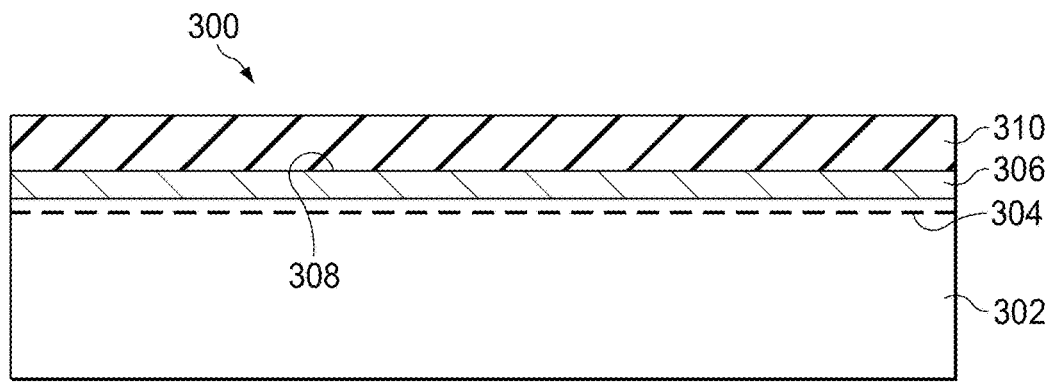

FIGS. 3A-3F illustrate cross-sectional schematic views of a semiconductor process wafer portion at various stages of an example process flow for fabricating a GaN device having dual surface passivation layers as part of a composite surface passivation layer or structure according to an implementation of the disclosure. FIG. 3A depicts a substrate portion 300 comprising an HEMT heterostructure wherein an AlGaN layer 306 is provided as an epitaxial layer formed over a GaN layer 302. As noted above, a heterojunction including a 2DEG channel 304 may be formed at the AlGaN/GaN interface. In some examples, other types of deposition methods, such as, e.g., chemical vapor deposition or atomic layer deposition, may be used to form AlGaN layer 306 over GaN layer 302. In some examples, GaN layer 302 may be provided as part of a GaN substrate. In some examples, AlGaN layer 306 and GaN layer 302 may be provided as active layers formed on a substrate comprising a different material, e.g., silicon, silicon carbide, sapphire, or other semiconductor material. In some examples, AlGaN layer 306 may have a thickness of about 20-30 nanometers (nm) and GaN layer 302 may have a thickness ranging from tens of nanometers to one or more micrometers or microns (μm), although other variations are possible depending on breakdown voltage requirements and other considerations. FIG. 3B depicts substrate portion 300 having a first surface passivation layer 310 formed over a top surface 308 of AlGaN layer 306 using a first passivation process (e.g., Process A). In one example, surface passivation layer 310 may comprise a silicon nitride layer of about 65 nm, e.g., with a range of about ±5%, formed by an LPCVD process using an oxygen ($O_2$)-rich environment when a semiconductor process wafer including the GaN device is loaded into an LPCVD chamber or tube. In one example, $O_2$ levels of approximately 600 parts per million (ppm) to 1000 ppm may be used. Other process conditions relative to Process A will be set forth further below in a comparative discussion with respect to a second surface passivation process (e.g., Process B) provided according to an implementation of the present disclosure. As previously noted, Process A may be controlled or otherwise regulated such that passivation layer 310 or a portion thereof is operative to condition the surface of active layers 306/302 in a portion proximate to a gate region of the device so as to optimize the device's TDDB performance.

Figure 3C:
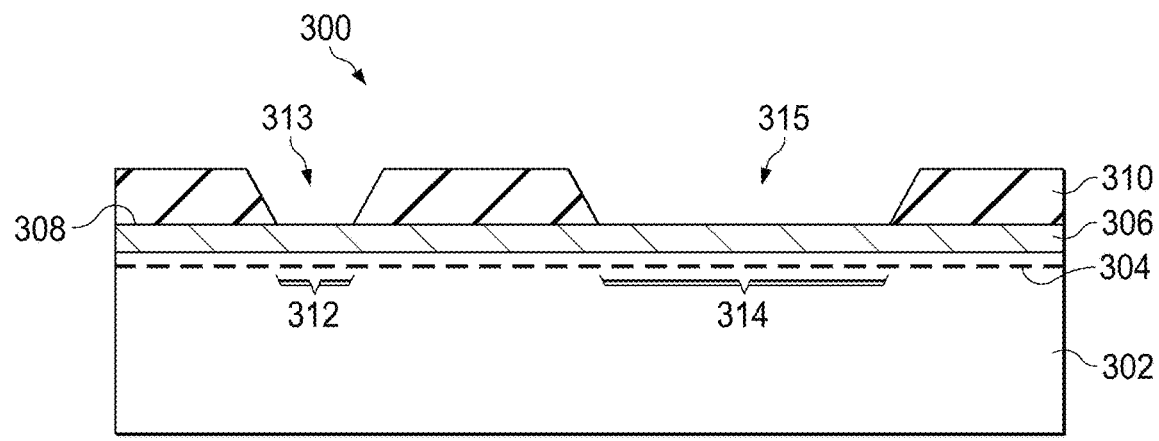

FIG. 3C depicts the patterning of first surface passivation layer 310 to define a gate region opening 313 over a gate region 312 and a drain access region opening 315 over a drain access region 314 of substrate 300. As will be set forth further below, a photomask having appropriate features defined therein according to the present disclosure may be used for creating openings 313 and 315 in first surface passivation layer 310 by applying known or heretofore unknown photolithography and etch processes. Depending on implementation, example photolithography process recipes may involve, without limitation, a variety of light/radiation sources (e.g., 436 nm ("g-line"), 405 nm ("h-line"), 365 nm ("i-line"), 248 nm (deep UV or DUV), X-rays, etc.) and associated settings, e.g., numerical aperture (NA), partial coherence (sigma parameter), exposure time, and the like. Example etching techniques may comprise, without limitation, plasma etch techniques, dry etch techniques, chemical etch techniques, etc.

In one example, gate region opening 313 may comprise an opening having a lateral distance or length of about 2 μm along a horizontal axis (e.g., X-axis) parallel to the top surface 308. In one example, drain access region opening 315 may comprise an opening having a lateral distance or length of about 10 μm along the X-axis. It will be appreciated that the openings 313/315 may vary depending on design and implementation, e.g., whether a single or multiple openings are configured for respective passivations. For example, a single drain access region opening may range from about 0.5 μm to a few tens of a micron. In similar fashion, a gate region opening may vary from a sub-micron range to one or more microns.

Figure 3D:
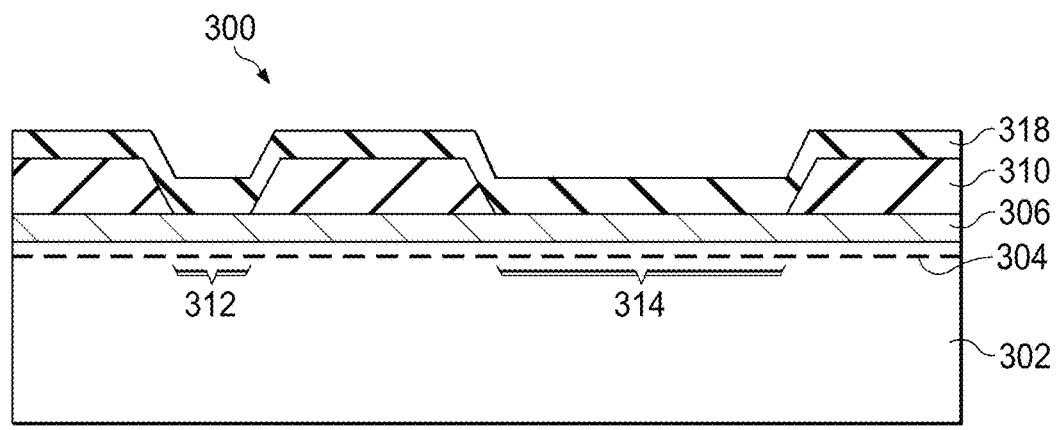

FIG. 3D depicts the formation of a second surface passivation layer 318 deposited over the patterned first surface passivation layer 310 using a second surface passivation process (e.g., Process B) according to an implementation of the present disclosure. In one example, second passivation layer 318 comprises a silicon nitride layer of about 35 nm, e.g., with a range of about ±5%, formed by an LPCVD process using an $O_2$ level less than approximately 30 ppm when the semiconductor process wafer containing the GaN device(s) is loaded into the LPCVD chamber or tube. Further, Process B may also involve a providing a pump stabilization pressure of about 6 milliTorr (mT) for about 60 minutes prior to commencing the deposition of the dielectric material for the second surface passivation layer. Because the tube pressure may be initially ramped from standard atmospheric pressure (e.g., about 760 Torr) to about 200 mT in an LPCVD process, Process B involves a ramping down to a lower vacuum of about 6 mT as a stabilization step before the actual deposition of the nitride material. In contrast, the tube pressure in Process A for depositing first surface passivation layer 310 may continue to remain at 200 mT. In addition, Process A involves higher $O_2$ levels than Process B during the loading of process wafers into the LPCVD tube as previously noted. Because of the conformal deposition of passivation material over the patterned first passivation layer 310, second surface passivation layer 318 includes a portion that directly overlies the active area portion exposed in the drain access region 314 due to the opening 315 in the patterned first passivation layer 310. By modifying the process conditions of Process B, second surface passivation layer 318 deposited in opening 315 may be configured to optimize the overall dynamic $R_{DSOn}$ performance of the device (e.g., $I_{DLin}$ may be maintained over time during hard switching stress conditions because $R_{DSOn}$ does not deteriorate (i.e., does not rapidly increase)).

In some example embodiments, other process conditions may remain substantially the same between the two surface passivation processes involving LPCVD. For instance, tube temperatures may commence at around 700° C. during wafer transfer and loading in both Process A and Process B, which may then be ramped to around 810° C. during deposition. Tube gases may involve nitrogen initially, with a higher $O_2$ environment used in Process A during wafer loading. During deposition, both Process A and Process B may involve supplying ammonia of about 0.4 standard liter per minute (SLM) and dichlorosilane (DCS) of about 0.08 SLM, which may be followed by nitrogen in a ramp down stage to atmospheric pressure. It will be recognized that the foregoing process conditions are merely illustrative and other variations are possible depending on implementation.

Figure 3E:
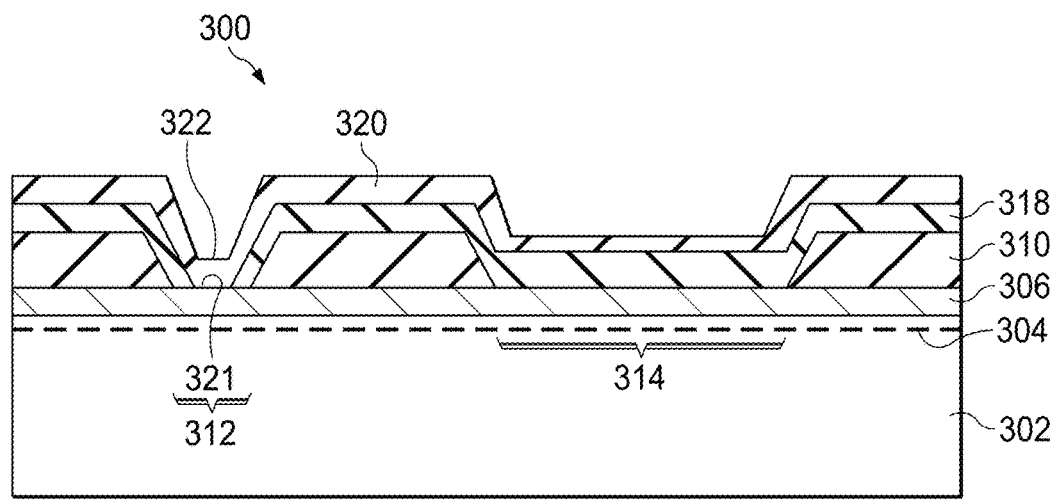

FIG. 3E depicts a cross-sectional view of substrate portion 300 after patterning second surface passivation layer 318 to define a gate contact opening 321 in gate region 312 and depositing a gate dielectric layer 320 that includes a gate dielectric portion 322 directly overlying AlGaN layer 306 in gate region 312. In one example, gate contact opening 321 may comprise an opening of about 1.0 μm along the X-axis parallel to AlGaN layer 306 and the gate dielectric layer 320 may comprise a nitride layer of about 25 nm, e.g., with a range of about ±5%. As such, any known or heretofore unknown lithography and deposition processes may be used in example embodiments of the present disclosure with respect to patterning surface passivation layer 318 and depositing the gate dielectric material thereover.

Figure 3F:
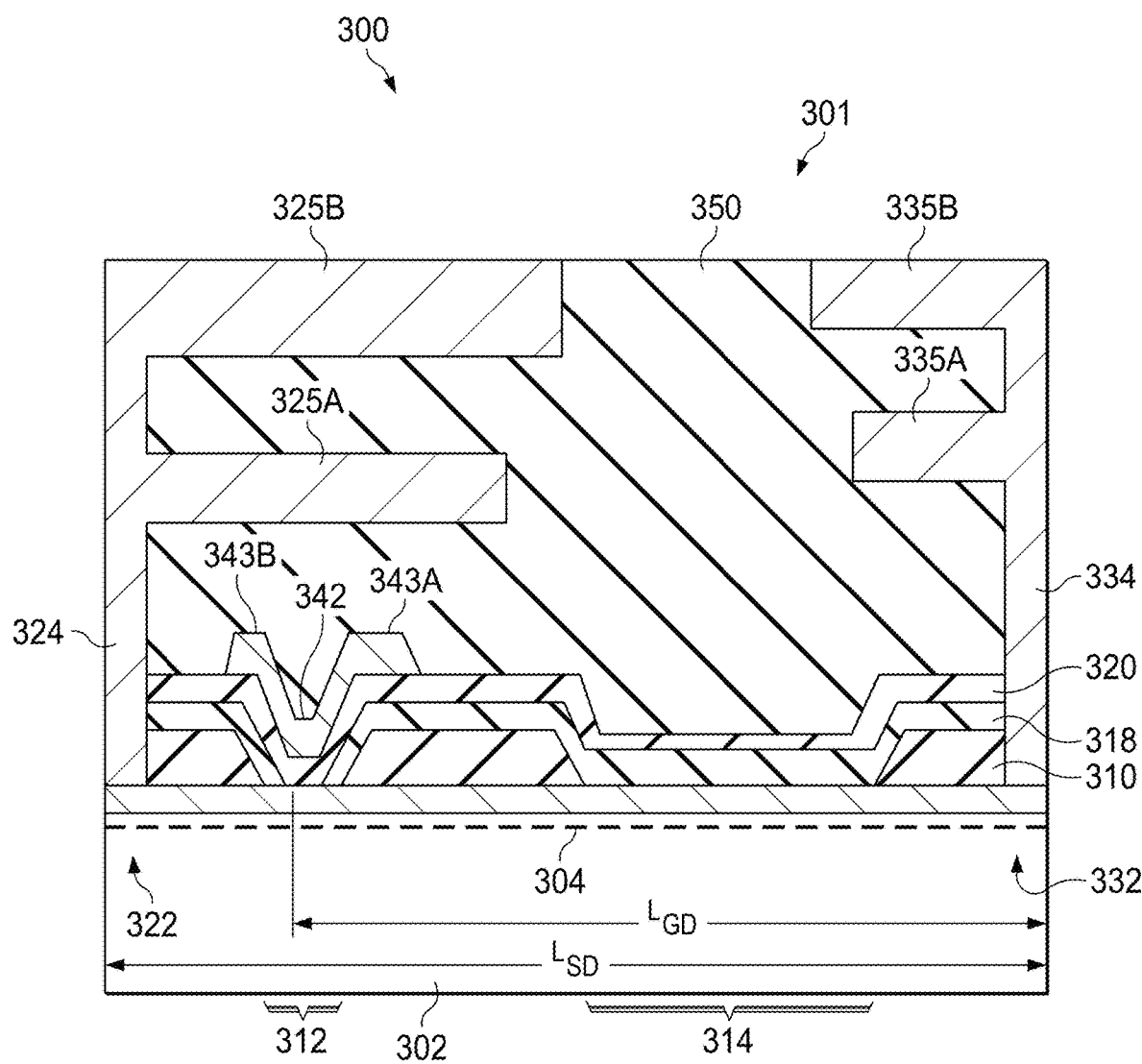

FIG. 3F depicts a cross-sectional view of a more completely formed device 301 including substrate portion 300 wherein a gate contact 342, a source contact 324 and a drain contact 334 are illustrated, which may be formed in any known or heretofore unknown metallization processes suitable for GaN device fabrication. As depicted, gate contact 342 may be formed over gate dielectric portion 322 and source and drain contacts 324, 334 may be formed over respective source and drain regions 322, 332 defined in the substrate portion 300 including AlGaN layer 306 and GaN layer 302, wherein the contacts may be formed of conductive materials such as titanium, nickel, aluminum, gold and ohmic metals and/or any combinations thereof. In one example, gate contact 342 may comprise a gate metal having a length around 4.0 μm. In one example, device 301 may be fabricated to have a source-to-drain length ($L_{SD}$) of about 24.50 μm and a gate-to-drain ($L_{SD}$) of about 20.75 μm. In some examples, source, drain and gate contacts 324, 334, 342, may each be optionally provided with one or more field plates, respectively, depending on implementation. By way of illustration, source contact or terminal 324 is exemplified with source field plates 325A/325B, drain contact or terminal 324 is exemplified with drain field plates 335A/335B, and gate contact 342 is exemplified with gate field plates 343A/343B, which are disposed in an ILD insulator layer 350.

Figure 4:
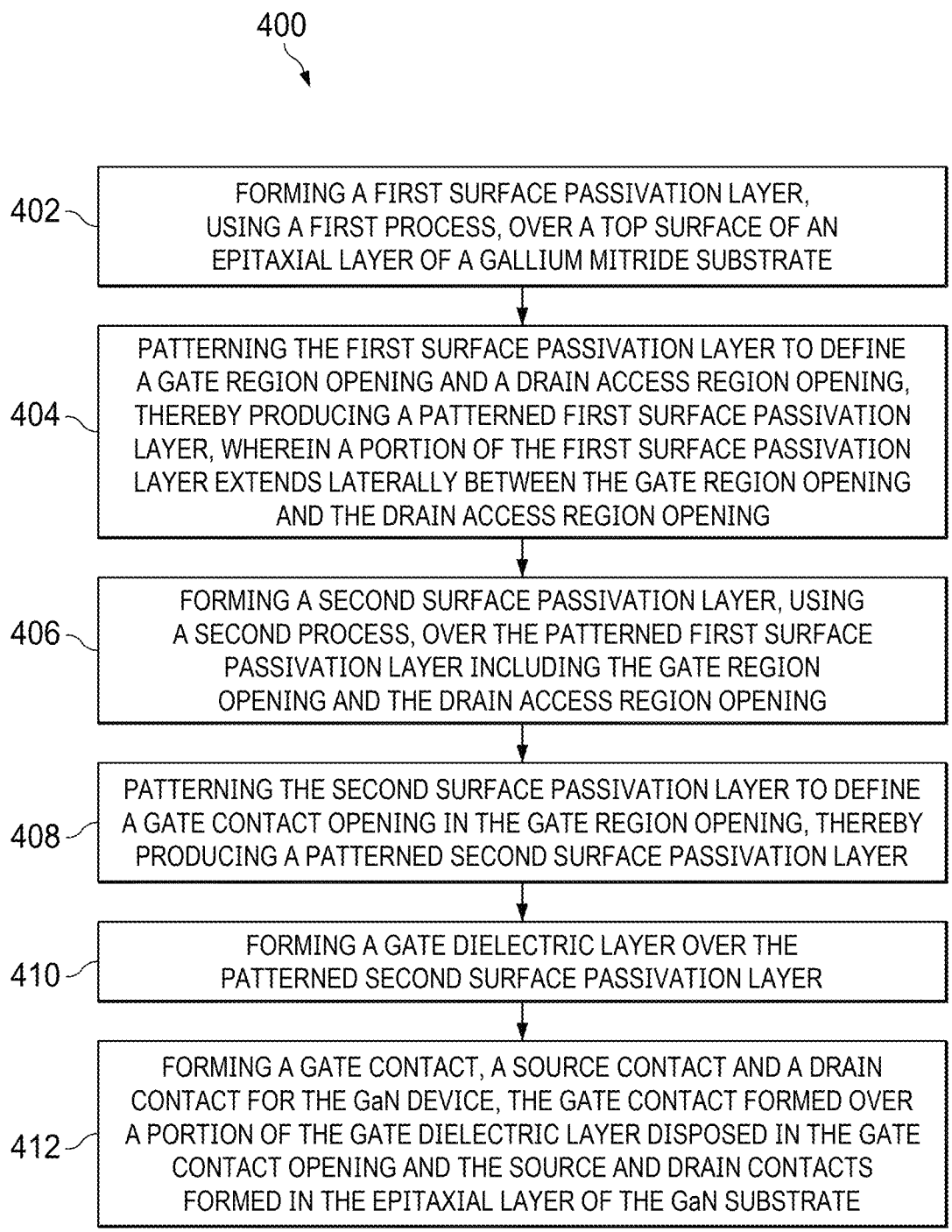
FIG. 4 depicts a flowchart of steps, blocks or acts of an example fabrication method according to an implementation of the disclosure.

FIG. 4 depicts a flowchart of steps, blocks or acts of an example fabrication method 400 according to an implementation of the disclosure. Method 400 may commence with forming a first surface passivation layer, using a first process, over a top surface of an epitaxial layer of a GaN substrate (block 402). At block 404, the first surface passivation layer may be patterned to define a gate region opening and a drain access region opening, thereby producing a patterned first surface passivation layer, wherein a portion of the first surface passivation layer extends laterally between the gate region opening and the drain access region opening. At block 406, a second surface passivation layer may be formed, using a second process, over the patterned first surface passivation layer including the gate region opening and the drain access region opening. At block 408, the second surface passivation layer may be patterned to define a gate contact opening in the gate region opening, thereby producing a patterned second surface passivation layer. At block 410, a gate dielectric layer may be formed over the patterned second surface passivation layer. At block 412, a gate contact, a source contact and a drain contact may be formed to complete contact formation/metallization for a GaN device, wherein the gate contact may be formed over a portion of the gate dielectric layer disposed in the gate contact opening and the source and drain contacts may be formed in respective regions of the epitaxial layer of the GaN substrate.

Figure 5A:
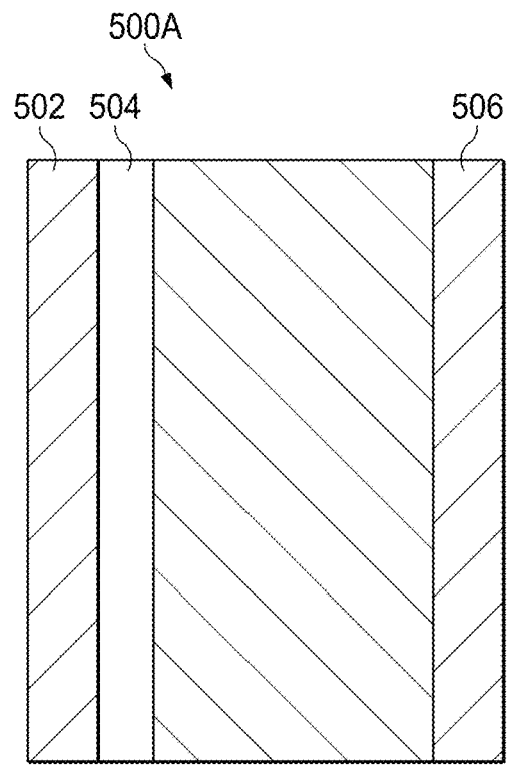
FIGS. 5A and 5B depict example photomasks used for patterning a GaN surface passivation layer in a baseline process and an embodiment of the disclosure, respectively.
Figure 5B:
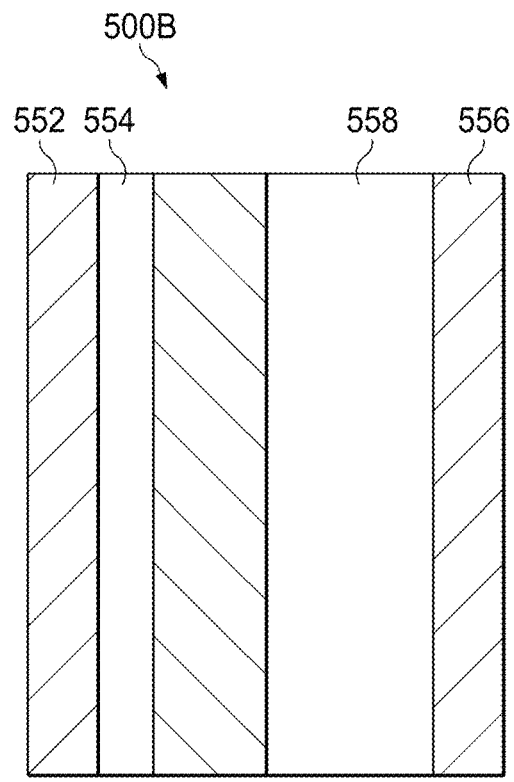

FIGS. 5A and 5B depict example photomasks used for patterning a GaN surface passivation layer in a baseline process and an embodiment of the disclosure, respectively. Photomask 500A used in fabricating a baseline GaN device, e.g., device 100 shown in FIG. 1, may include a region 502 for defining a source contact, a region 506 for defining a drain contact and a feature 504 for defining a gate region opening. Depending on whether positive photoresist (PR) or negative PR lithography process is used, photomask 500A may include the relevant features patterned as fully opaque (e.g., with chrome) and fully transparent areas (e.g., having no chrome) or vice versa, as is known in the art. Photomask 500B used in fabricating a GaN device of the disclosure, e.g., device 301 shown in FIG. 3F, may include a region 552 for defining a source contact, a region 556 for defining a drain contact as well as a feature 554 for defining a gate region opening and a feature 558 for defining a drain access region opening. Similar to photomask 500A, photomask 500B may include the relevant features patterned as fully opaque and fully transparent areas or vice versa, depending on whether positive or negative PR lithography is used.

Figure 6A:
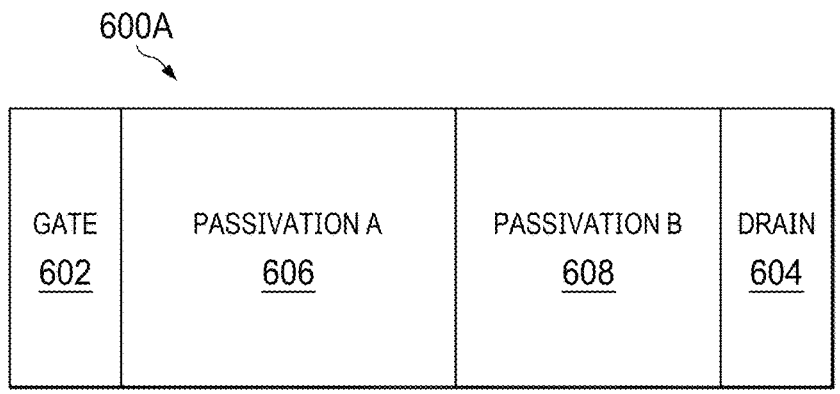
FIG. 6A-6D depict additional example patterns defining multiple openings distributed between gate and drain regions of an HEMT device that allow different passivation arrangements according to some embodiments of the disclosure.
Figure 6B:
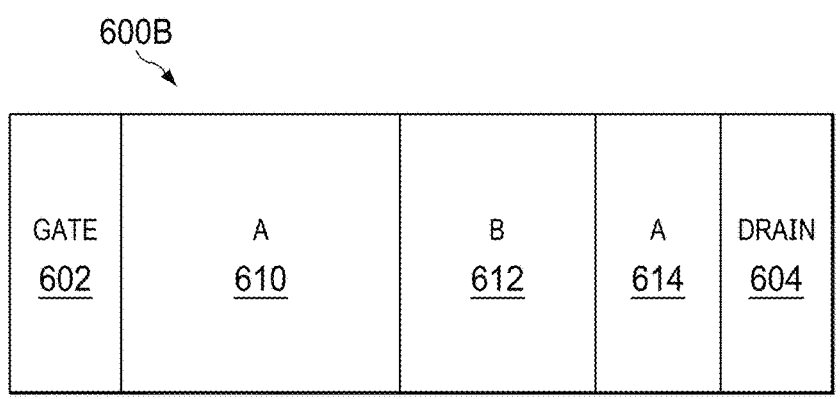
Figure 6C:
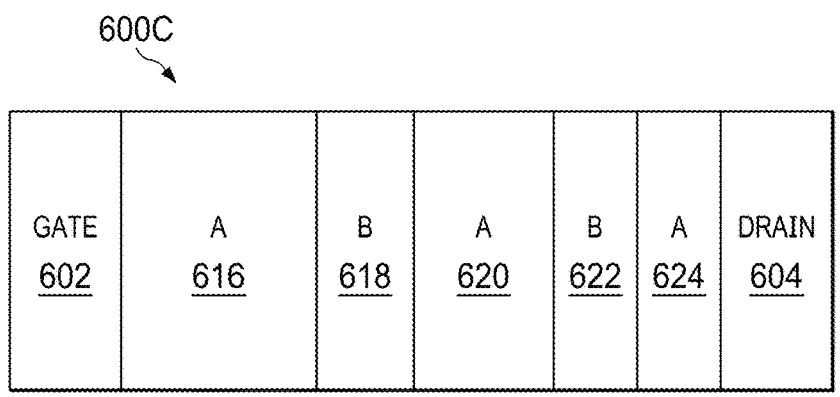
Figure 6D:
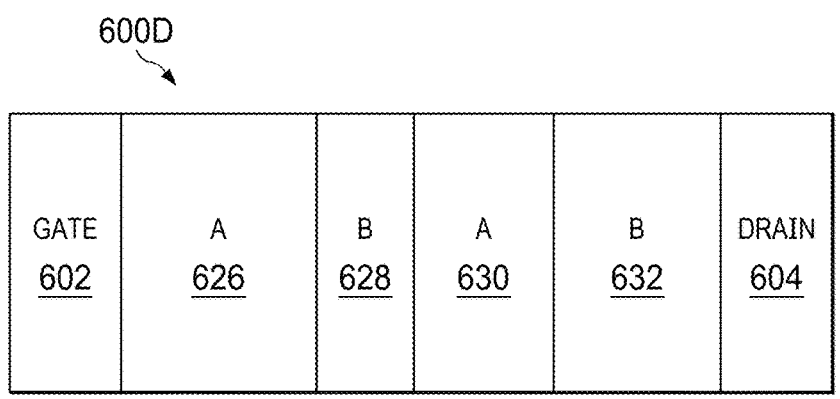

FIG. 6A-6D depict additional example patterns defining multiple openings in a passivation layer extended between gate and drain regions of an HEMT device that may be configured to provide for different passivation arrangements in a composite passivation structure according to some embodiments of the disclosure. Pattern 600A shown in FIG. 6A exemplifies depositing one passivation (e.g., Passivation A) in a region 606 proximate to gate 602 and another passivation (e.g., Passivation B) in a region 608 proximate to drain 604, wherein regions 606 and 608 are adjacent to each other. Pattern 600B shown in FIG. 6B exemplifies an arrangement wherein Passivation A is provided in two regions 610, 614 that laterally abut region 612 on each side having Passivation B. Pattern 600C of FIG. 6C exemplifies five passivation regions disposed between gate 602 and drain 604, where regions 616, 620, 624 each comprising Passivation A are alternately disposed with regions 618, 622 that each comprise Passivation B. In similar fashion, pattern 600D of FIG. 6D is illustrative of an arrangement having four passivation regions disposed between gate 602 and drain 604, wherein regions 626, 630 each comprising Passivation A alternate with regions 628, 632 that each have Passivation B. It should be noted that the foregoing passivation patterns are merely illustrative of a composite passivation structure of the present disclosure and various permutations and combinations of multiple passivations having differential characteristics and/or regional sizes may be provided according to the teachings herein.

Although LPCVD processes have been particularly exemplified in the foregoing description, some example embodiments may include surface passivation processes that may involve other deposition techniques. Further, in addition to HEMT devices having AlGaN/GaN interfaces, some example devices may include devices made from other Group III nitride materials that may also form a 2DEG channel at the interface due to amalgamation with a different Group III nitride material. Whereas example embodiments have been set forth with a TDDB-optimized surface passivation process as a first surface passivation process and an $R_{DSOn}$-optimized surface passivation process as a second surface passivation process, additional and/or alternative embodiments may include a process flow where the order of the passivations may be reversed in fabricating an HEMT device with appropriate modifications applied in depositing and patterning the dielectric layers, mutatis mutandis, as previously noted. Still further, in some example embodiments of the present disclosure, a GaN device may include additional layers such as cap layers, buffer layers, and the like. Because example embodiments provide a GaN device that optimizes both TDDB and $R_{DSOn}$ performance, increased voltage margins may be obtained for a given device size. Some example embodiments may therefore advantageously allow device half pitch reduction for a particular high voltage application.

Whereas certain embodiments have been exemplified with two separate passivation processes in addition to depositing a gate dielectric material, it should be appreciated that additional and/or alternative embodiments may involve using the gate dielectric material as a second passivation material wherein the first passivation layer is patterned to include a gate opening as well as a drain access region opening. Moreover, multi-passivation process flows of the present disclosure can also be used in other GaN devices such as p-GaN based enhancement mode (E-mode) devices that do not have a gate dielectric material. In such arrangements, an additional mask may be required to create the drain access region opening, whereby a suitable dielectric material may be applied as a second passivation that optimizes the $R_{DSOn}$ performance.

Although various implementations have been shown and described in detail, the claims are not limited to any particular implementation or example. None of the above Detailed Description should be read as implying that any particular component, element, step, act, or function is essential such that it must be included in the scope of the claims. Where the phrases such as "at least one of A and B" or phrases of similar import are recited or described, such a phrase should be understood to mean "only A, only B, or both A and B." Reference to an element in the singular is not intended to mean "one and only one" unless explicitly so stated, but rather "one or more." All structural and functional equivalents to the elements of the above-described implementations that are known to those of ordinary skill in the art are expressly incorporated herein by reference and are intended to be encompassed by the present claims.

It should further be understood that the order or sequence of the acts, steps, functions, components or blocks illustrated in any of the flowcharts depicted in the drawing Figures of the present disclosure may be modified, altered, replaced, customized or otherwise rearranged within a particular flowchart, including deletion or omission of a particular act, step, function, component or block. Moreover, the acts, steps, functions, components or blocks illustrated in a particular flowchart may be inter-mixed or otherwise inter-arranged or rearranged with the acts, steps, functions, components or blocks illustrated in another flowchart in order to effectuate additional variations, modifications and configurations with respect to one or more processes for purposes of the present patent disclosure. Accordingly, those skilled in the art will recognize that the example implementations described herein can be practiced with various modifications and alterations within the spirit and scope of the claims appended below.

What is claimed is:

1. A method of fabricating a semiconductor device, the method comprising:
   providing a gallium nitride (GaN) substrate with an epitaxial layer formed thereover, the epitaxial layer forming a heterojunction with the GaN substrate; and
   forming a composite surface passivation layer over the epitaxial layer, the composite surface passivation layer comprising a first passivation layer portion formed at a first region of the semiconductor device and a second passivation layer portion formed at a second region of the semiconductor device, wherein the first passivation layer portion is formed as part of a first process and the second passivation layer portion is formed as part of a second process, wherein
   the first passivation layer portion is formed proximate to a drain access region of the semiconductor device, the first passivation layer portion comprising a first dielectric material deposited in the first process involving a lower $O_2$ environment than the second process.

2. The method as recited in claim 1, wherein the second passivation layer portion is formed proximate to a gate region of the semiconductor device, the second passivation layer portion comprising a second dielectric material deposited in the second process involving a higher $O_2$ environment than the first process.

3. The method as recited in claim 1, wherein a gate dielectric layer is provided as one of the first or second passivation layers.

4. The method as recited in claim 1, further comprising:
   forming a gate dielectric layer over a gate region of the semiconductor device, the gate dielectric layer separate from the first and second passivation layer portions.

5. The method as recited in claim 1, wherein the first passivation layer portion comprises a silicon nitride layer formed by the first process comprising a Low-Pressure Chemical Vapor Deposition (LPCVD) process using an $O_2$ level less than approximately 30 ppm.

6. The method as recited in claim 1, wherein the second passivation layer portion comprises a silicon nitride layer formed by the second process comprising a Low-Pressure Chemical Vapor Deposition (LPCVD) process using an oxygen ($O_2$) level of approximately 600 parts per million (ppm) to 1000 ppm.

7. The method as recited in claim 1, wherein the epitaxial layer is formed as an aluminum gallium nitride (AlGaN) layer.

8. The method as recited in claim 1, wherein the first and second processes each comprise a Low-Pressure Chemical Vapor Deposition (LPCVD) process, the first process using a first pump stabilization pressure, the first pump stabilization pressure less than a second pump stabilization pressure used in the second process.

9. The method as recited in claim 1, wherein the first process is configured to deposit a first dielectric material for optimizing a dynamic $R_{DSOn}$ performance parameter of the semiconductor device.

10. The method as recited in claim 1, wherein the second process is configured to deposit a second dielectric material for optimizing a Time-Dependent Dielectric Breakdown (TDDB) parameter of the semiconductor device.

11. A method of fabricating a gallium nitride (GaN) device, the method comprising:
forming a first passivation layer, using a first process, over a top surface of an epitaxial layer of a gallium nitride (GaN) substrate;
producing a patterned first passivation layer by removing portions of the first passivation layer corresponding to a gate region opening and a drain access region opening;
forming a second passivation layer, using a second process, over the patterned first passivation layer including the gate region opening and the drain access region opening;
producing a patterned second passivation layer by removing a portion of the second passivation layer corresponding to a gate contact opening in the gate region opening;
forming a gate dielectric layer over the patterned second passivation layer; and
forming a gate contact, a source contact and a drain contact for the GaN device, the gate contact formed over a portion of the gate dielectric layer disposed in the gate contact opening and the source and drain contacts formed in the epitaxial layer of the GaN substrate, wherein:
a portion of the epitaxial layer located laterally between the gate contact and the drain contact includes a first section contacting the first passivation layer and a second section contacting the second passivation layer; and
the first and second processes each comprise a Low-Pressure Chemical Vapor Deposition (LPCVD) process, the first process using a first pump stabilization pressure greater than a second pump stabilization pressure used in the second process.

12. The method as recited in claim 11, wherein the first passivation layer comprises a silicon nitride layer formed by the first process comprising a Low-Pressure Chemical Vapor Deposition (LPCVD) process using an oxygen ($O_2$) level of approximately 600 parts per million (ppm) to 1000 ppm when the GaN device is loaded into an LPCVD chamber.

13. The method as recited in claim 11, wherein the second passivation layer comprises a silicon nitride layer formed by the second process comprising an LPCVD process using (i) an $O_2$ level less than approximately 30 ppm when the GaN device is loaded into an LPCVD chamber, and (ii) providing a pump stabilization pressure of about 6 milliTorr (mT) prior to commencing deposition of the second passivation layer.

14. The method as recited in claim 11, wherein the drain access region opening is laterally separated from the gate region opening by a distance in the epitaxial layer that is at least partially overlaid by a portion of the first passivation layer.

15. The method as recited in claim 11, wherein the epitaxial layer is formed as an aluminum gallium nitride (AlGaN) layer.

16. The method as recited in claim 11, wherein the gate dielectric layer is formed as a silicon nitride layer.

17. The method as recited in claim 11, wherein:
the first section is proximate to the gate contact; and
the second section is proximate to the drain contact.

18. The method as recited in claim 11, wherein the first and second processes each comprise a Low-Pressure Chemical Vapor Deposition (LPCVD) process, the first process using an oxygen ($O_2$) level that is greater than an oxygen ($O_2$) level used in the second process.

19. The method as recited in claim 11, wherein the first process deposits a first dielectric material for optimizing a Time-Dependent Dielectric Breakdown (TDDB) parameter of the GaN device.

20. The method as recited in claim 11, wherein the second process deposits a second dielectric material for optimizing a dynamic $R_{DSOn}$ performance parameter of the GaN device.

21. A method of fabricating a semiconductor device, the method comprising:
providing a gallium nitride (GaN) substrate with an epitaxial layer formed thereover, the epitaxial layer forming a heterojunction with the GaN substrate; and
forming a composite surface passivation layer over the epitaxial layer, the composite surface passivation layer including a first passivation layer portion proximate to a drain region of the semiconductor device and a second passivation layer portion proximate to a gate region of the semiconductor device, wherein:
the first passivation layer portion is formed as a result of a first process configured to deposit a first dielectric material for optimizing a dynamic $R_{DSOn}$ performance parameter of the semiconductor device; and
the second passivation layer portion is formed as part of a second process configured to deposit a second dielectric material for optimizing a Time-Dependent Dielectric Breakdown (TDDB) parameter of the semiconductor device, wherein the second process involves a higher $O_2$ environment than the first process.

22. The method as recited in claim 21, wherein the first passivation layer portion comprises a silicon nitride layer formed by the first process including a Low-Pressure Chemical Vapor Deposition (LPCVD) process using an oxygen ($O_2$) level less than approximately 30 ppm.

23. The method as recited in claim 21, wherein the second passivation layer portion comprises a silicon nitride layer formed by the second process including a Low-Pressure Chemical Vapor Deposition (LPCVD) process using an oxygen ($O_2$) level of approximately 600 parts per million (ppm) to 1000 ppm.

24. The method as recited in claim 21, wherein the first process uses a first pump stabilization pressure less than a second pump stabilization pressure of the second process.

25. The method as recited in claim 21, wherein the epitaxial layer is formed as an aluminum gallium nitride (AlGaN) layer.

* * * * *